United States Patent [19]

Edmondson et al.

[11] Patent Number: 5,680,544
[45] Date of Patent: Oct. 21, 1997

[54] METHOD FOR TESTING AN ON-CHIP CACHE FOR REPAIR

[75] Inventors: John Edmondson, Cambridge; Scott Taylor, Marlboro, both of Mass.

[73] Assignee: Digital Equipment Corporation, Maynard, Mass.

[21] Appl. No.: 523,297

[22] Filed: Sep. 5, 1995

[51] Int. Cl.$^6$ ............................................. G11C 29/00
[52] U.S. Cl. ........................... 395/183.18; 371/21.2; 365/201
[58] Field of Search ................ 395/182.03, 182.04, 395/182.05, 183.01, 183.16, 183.18, 185.07; 371/21.1, 21.2, 21.3, 21.6, 40.1, 51.1; 365/200, 201

[56] References Cited

U.S. PATENT DOCUMENTS

| | | | |
|---|---|---|---|
| Re. 34,445 | 11/1993 | Hayes et al. | 371/21.1 |
| 5,195,096 | 3/1993 | Moore | 371/51.1 |
| 5,305,327 | 4/1994 | Huckstepp | 371/21.3 |
| 5,471,480 | 11/1995 | You | 371/21.1 |
| 5,513,344 | 4/1996 | Nakamura | 395/185.18 |
| 5,539,878 | 7/1996 | Kikinis | 395/183.06 |
| 5,555,249 | 9/1996 | Hiley et al. | 371/21.1 |

*Primary Examiner*—Robert W. Beausoliel, Jr.
*Assistant Examiner*—Albert Decady
*Attorney, Agent, or Firm*—Joanne N. Pappas; Gary E. Ross; Arthur W. Fisher

[57] ABSTRACT

A test system is provided which tests the on chip cache of a microprocessor (CPU). The test system provides test vectors to the CPU in a specified sequences. The CPU then uses its internal general purpose registers to write the vectors the cache memory locations. After writing, the data is read back and compared to an expected value. The results are then stored in other general purpose registers of the CPU. Using the CPUs general purpose registers to record the test results allows the test system to test many cache locations in parallel. Furthermore the test system allows the test to proceed in a fixed number of CPU clock cycles regardless of any detected errors.

21 Claims, 3 Drawing Sheets

METHOD FOR TESTING AN ON-CHIP CACHE FOR REPAIR

BACKGROUND OF THE INVENTION

This invention relates generally to computer systems and more particularly to testing of cache memories resident on a central processing unit.

As is generally known in the art, microprocessor chips which are used to make up a computer system are generally fabricated from a wafer of semiconductor material. In fact, there are usually many microprocessor chips made from a single semiconductor wafer. In order to avoid additional fabrication costs of defective microprocessor chips, the microprocessors are generally tested while still in wafer form. Testing of the microprocessors in wafer form involves the use of a so-called chip tester. A chip tester uses electromechanical probing means to contact an individual microprocessor on a wafer. A test system connected to the probe is then used to test the functionality of the microprocessor.

There are a variety of tests which are performed on the microprocessor chip while still attached to the wafer. One of these tests involves the verification of the on-chip RAM or cache memories. Certain microprocessors such as the Digital Equipment Corporation Model 21164 include what is known as repairable RAM or repairable cache. The repairable RAM is a RAM that can have a flaw and still be used in a microprocessor. That is, the RAM can be found to have a certain number of defects and still result in an overall good or shippable microprocessor chip.

Repairable RAM is typically constructed of rows called word lines and columns called bit lines. To read data from such a RAM a signal is driven onto the word line which activates a particular storage cell which in turn places its data out on the bit lines. The output data is then transmitted to the particular device which requested the data.

Repairable RAMs are typically constructed to have any number of spare rows depending upon the amount of physical chip area available in the microprocessor design. In some repairable RAM designs such as the Digital Equipment Corporation Model 21164, there are also included spare columns in the RAM to allow for the repair of the RAM on the detection of a defective column.

There are several well known methods for testing and repairing repairable RAMs. Among these methods are external built in self test (BiSt) by special logic, and BiSt by a program running on a general purpose execution unit within the chip being tested. Each of these methods have their own drawbacks.

The first method (BiSt by special logic) is costly in that it requires added control logic resulting in added chip area. This problem is exacerbated by designs employing redundant columns as well as redundant rows. The second method is costly in that it results in a longer test time unless extra (costly) data paths are provided in the chip.

One of the simplest methods of testing the RAM on a CPU chip is to provide external access to the RAM at the input/output (I/O) pins of the chip. The access may be either serial or parallel or some combination thereof.

Generally, to repair a defective RAM, a determination is first made as to where the faults are, i.e. the defective row and/or columns are first identified. The defective row or column is then repaired by replacing it with one of the spare rows or columns. Replacement involves the remapping of addresses such that an address transmitted to the defective RAM would be decoded to select the replacement row or spare row, rather than the original row containing the defect. The replacement of columns results in all accesses to the RAM subsection using the replacement column rather than the defective column.

The use of repairable RAMs is well known in the art and is typically used for the construction of RAM chips. However, the testing of RAM chips typically requires a use of a specialized tester known as a RAM tester. A RAM tester is typically capable of implementing, external to the RAM under test, those kinds of data structures that allow the tester to be able to determine which row or column is in need of repair.

The testers used in testing RAM chips are not typically suitable for testing microprocessor chips since in many microprocessor designs (for example the 21164 microprocessor), the row access, address lines, and data lines are not routed such that the RAM can be accessed to via the I/O pins on the chip. That is, the RAM is embedded in the microprocessor.

Although a RAM tester is a specific type of test system, some manufacturing processes will use a separate RAM tester to test a CPU by incorporating a multiplexer into the design of the chip that is only used for test purposes. The multiplexor makes the data and address lines (i.e. electrical connections) of a RAM available by changing the meaning of I/O pins on the microprocessor chip. That is, the I/O pins of the CPU are remapped to allow direct access to the RAM from the I/O pins. This approach, however, is costly in both money and chip real estate since it requires the addition of specialized design features in the chip which are used only for test purposes.

Another problem facing microprocessor designers and microprocessor testers is that the operation of a microprocessor is based upon simulation data and that simulation data is usually used to generate a test program for use by a chip tester. The simulation data usually assumes that the fetches from memory return the expected data and as such, the chip needs to operate in the proper timing sequence. However, a defective RAM will obviously cause the microprocessor to return erroneous data which requires that the test system and thus the test program make use of conditional branching instructions and have the ability to handle control flow changes as the result of erroneous data. This leads to a very complex and usually slower test for the microprocessor. A test program which tried to mirror the proper operational cycles no matter how many errors were in the RAM would, with prior art approaches, end up having the microprocessor operate on erroneous data and therefore, invalidate further testing of the microprocessor.

It would be advantageous therefore, to have a chip testing system that was capable of running a test sequence in the exact number of cycles expected by the microprocessor regardless of any errors which existed in the on-chip RAM.

SUMMARY OF THE INVENTION

In accordance with one aspect of the present invention, a test system for testing a random access memory (RAM) includes means for testing a plurality of storage cells of said RAM. The test system further includes means for storing an output of the testing means. The testing means and storing means operate in a fixed number of central processing unit (CPU) clock cycles as defined by a test executed by said testing means regardless of any detected errors. With such an arrangement, a RAM can be tested quickly even in the presence of detected errors.

In accordance with a further aspect of the present invention a method of testing a random access memory (RAM)

includes writing data to a plurality of storage cells of the RAM. After the data is written, the contents of each of the same storage cells are read in parallel and compared in parallel to an expected value. After comparing the read data, the test results for each storage location is recorded in parallel. Each of the steps in the method occur within a fixed number of CPU clock cycles regardless of whether an error in the RAM has been detected. With such an arrangement, an efficient RAM test is achieved.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENT

Figure 1:
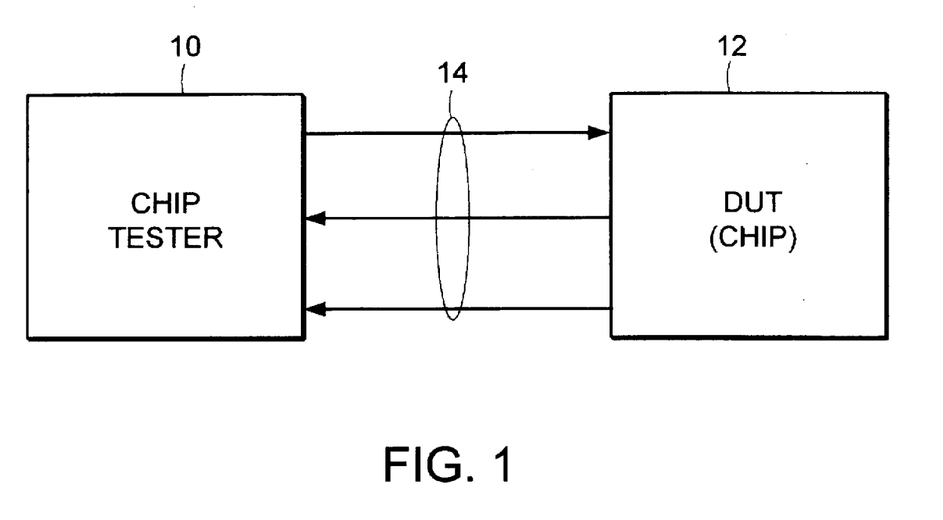
FIG. 1 is a block diagram of a chip tester testing a microprocessor chip.

Referring now to FIG. 1, chip tester 10 is shown to be coupled to a device under test (DUT) 12 via interface lines 14. Here the DUT is a microprocessor chip preferably still connected to the semiconductor wafer from which it was fabricated. The DUT may be any known microprocessor such as the AXP21164 manufactured by Digital Equipment Corporation. The interface between the DUT and the chip tester typically includes an electromechanical contact such as wafer probes (not shown) connected to signal lines 14. A test of a microprocessor chip is typically performed by first establishing mechanical contact between the wafer probes and contact pads at the perimeter of the DUT. Once contact is established, signals are transferred between the DUT and the chip tester in order to verify correct operation of the DUT.

Test systems generally operate under software control and use programmed instructions to cause the tester to send particular signals (called test patterns) to the DUT at particular times. The programmed instructions may be based on a behavioral model of the particular DUT. A behavioral model is used to create the test patterns transmitted to the DUT during a test. The behavioral model is a record of how a correctly operating chip will react to various input stimuli. According to the preferred embodiment, the DUT is presented with test patterns resulting in the RAM of the DUT to be tested according to a standard "march" algorithm.

Figure 2:
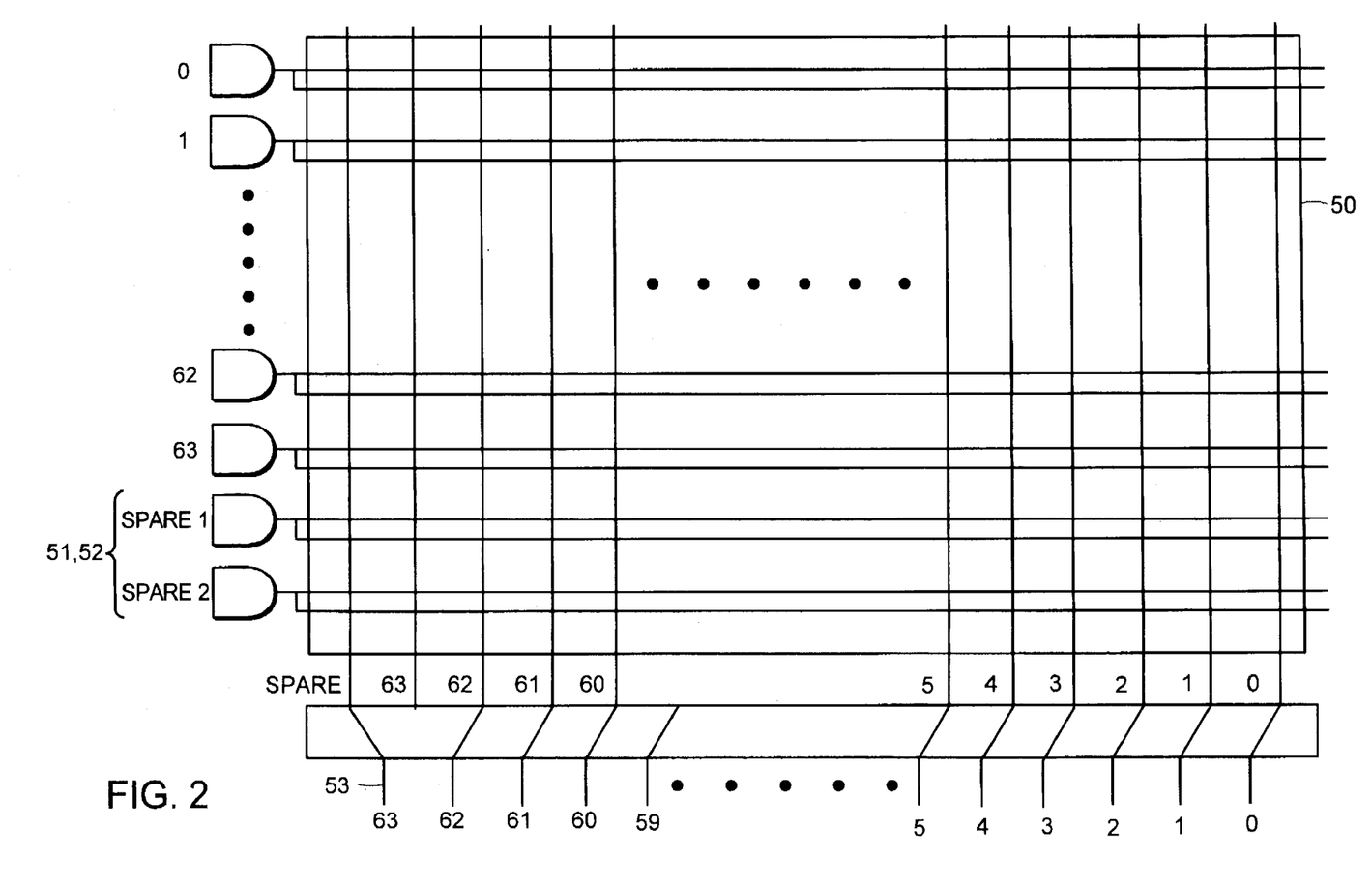
FIG. 2 is a diagrammatic representation of a repairable RAM included in the microprocessor chip of FIG. 1.

Referring now to FIG. 2, a sub-section of a repairable RAM 50, such as that found in the cache of the Digital Equipment Corp. 21164 microprocessor, is shown to include 64 rows and columns. In addition, the RAM section includes two spare rows and one spare column. Here RAM 50 is a section of a memory array which has been divided into twelve sections, each of which have a number of redundant rows and columns. Each of the twelve sections is further divided into four subsections (e.g. subsection 50) arranged in a square (top-left, top-right, bottom-left, and bottom-right). Each subsection includes two redundant rows 51,52 and one redundant column 53 as shown in RAM sub-section 50.

RAM 50 is addressed using row decoder logic (not shown) to address a particular row of the RAM. Once addressed, the data from each cell is loaded, in parallel, onto the 64 bit lines (columns). A defective RAM will have its row decoder logic reprogrammed by burning fuses contained therein. This will cause any addressing of a defective row to select a spare row rather than the defective row. The reprogramming of the decoder logic may be achieved using any well known method (such as the burning of fusable links with a laser) and as such will not be discussed here. Similarly, the bit steering logic (not shown) used to redirect the selection of a defective column to a spare column is achieved in a like manner.

According to the preferred embodiment, a constraint may be placed on the reprogramming of the row decoder logic for the top two and bottom two subsections such that the row replacement for the top two subsections (top-left and top-right) be the same and the row replacement for the bottom two subsections (bottom-left and bottom-right) be the same. Similarly, a constraint may be placed on the column replacement such that the two left subsections (top-left and bottom-left) have the same column replacement and the two right subsections (top-right and bottom right) have the same column replacement. This constraint is a design choice which saves chip area and is not a necessary limitation of the present invention.

Figure 3:
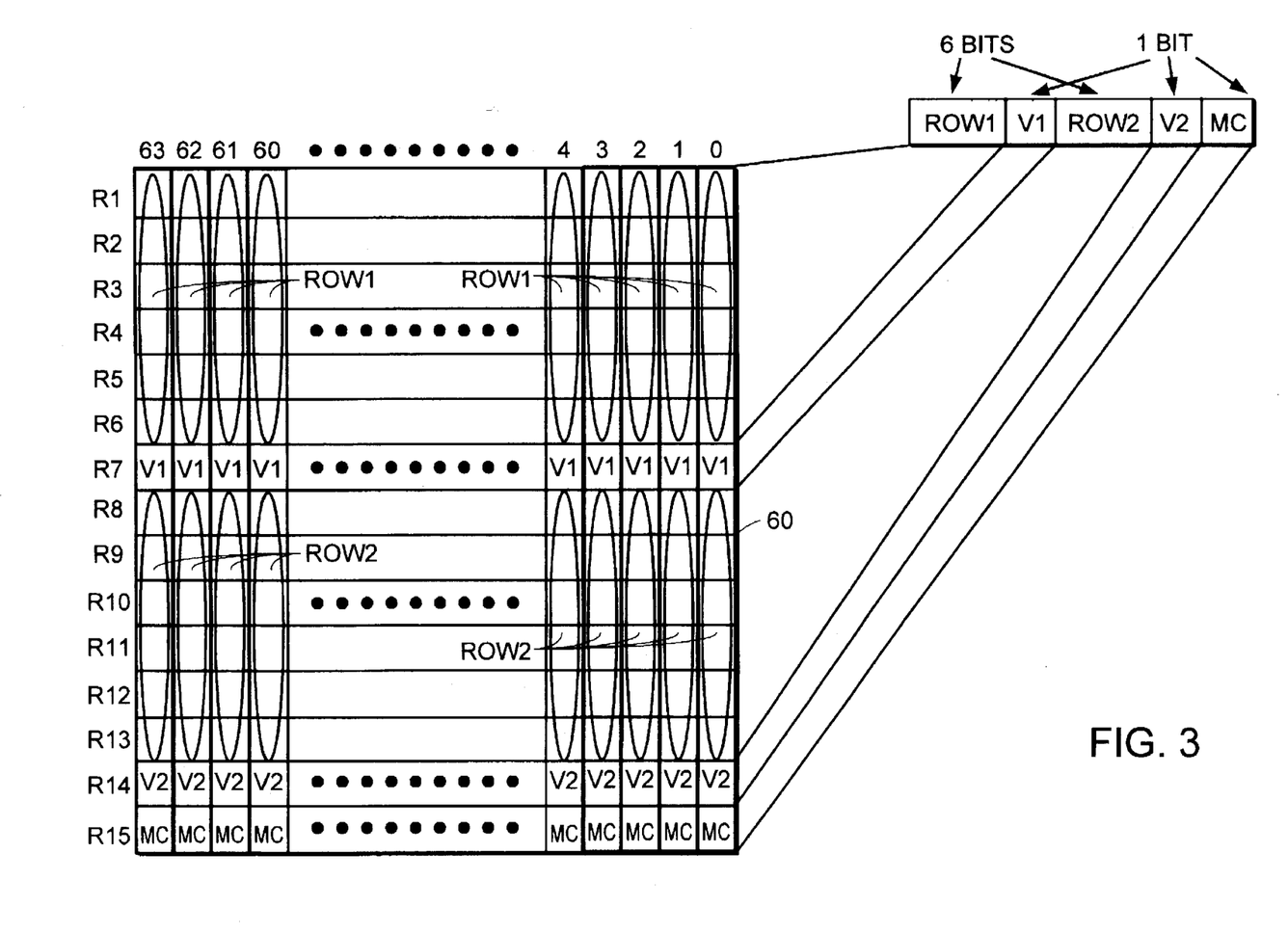
FIG. 3 is diagram of test data stored in the registers of the microprocessor of FIG. 1.

In accordance with the present invention, the general purpose registers of a microprocessor (i.e. DUT) are used during testing to store the results of testing the RAM structures which are incorporated into the same chip and are directly addressable by the microprocessor. Referring now to FIG. 3, test data array 60 is shown to include general purpose registers R1–R15 and according to the present invention is used to store the test results for a single subsection of RAM 50. Each register is 64 bits wide.

Using 15 general purpose registers and providing the proper test patterns, enough data can be captured and compressed to allow for subsequent determination of the reparability of the relevant RAM subsection.

The storage locations of a RAM device under test may be exercised using a test program represented in pseudocode as show below:

```
<WRITE BACKGROUND OF 0 TO THE SECTION>
<CLEAR R0 THROUGH R15>
MAINLOOP:

<PICK A "NEW" VALUE AND AN "OLD" VALUE FOR THIS LOOP ITERATION>
<FOR EACH LOCATION IN THE RAM SECTION, IN SEQUENCE:
    <READ THE LOCATION>
    <COMPARE THE DATA TO THE "OLD" VALUE WITH AN XOR INSTRUCTION>
    <PUT THE RESULT OF THE XOR IN R0>
    <WRITE THE "NEW" VALUE IN THE LOCATION>
    <USE "THE ALGORITHM" TO UPDATE REGISTERS R1 THROUGH R15>
```

-continued

```
>
<DETERMINE IF ANOTHER LOOP ITERATION IS NECESSARY>
<GOTO MAINLOOP IF ANOTHER LOOP ITERATION IS NECESSARY>
<WRITE R1 THROUGH R15 OFF-CHIP>
```

The above test program implements a standard march algorithm. One exemplary form of this program requires two passes through MAINLOOP. Prior to executing the MAINLOOP, a background of 0 is written to the RAM section under test. That is, each RAM location is written with the value 0. In the first pass through MAINLOOP, each RAM location is read and compared via the XOR instruction to the value 0. The data value of 1 is then written to all locations. In the second pass through MAINLOOP, each location is read and compared to the value of 1. Zeros are then written to all locations. This version of a RAM test program detects many RAM defects. However it is presented for illustration only and should not be construed as a limitation of the present invention. Indeed, more complex data patterns and additional iterations may be used to detect more subtle RAM defects. The invention, described in more detail below accommodates both the simple and complex data pattern tests.

Referring again to FIG. 3, the fifteen general purpose registers R1-R15 of test data array 60 are each shown to be 64 bits in length (i.e. each is able to store 64 bits of data). During normal operation of a computer to which these registers may belong, data is typically stored and used in a conventional manner where one register stores a section of data for use by the computer. However, according to the present invention, the registers will be used in a manner which allows them to store all the error information corresponding to a section of RAM under test. Here, the section of RAM is a 64 entry×64 bit section (FIG. 2). It should be noted that the size of the RAM section may be larger or smaller and thus is not a limitation of the present invention.

Each bit position of the fifteen registers represents each column of a RAM section under test (see FIG. 2). Thus for example, bit position 4 of registers R1-R15 corresponds to column 4 of the RAM section under test. During the RAM test, according to the general test program shown above, data will be read and written to each row of the RAM under test. If an error is detected in any bit position (i.e. column number) of a particular row, that error information will be stored in the corresponding bit position of registers R1-R15.

Any bit error for a particular row will be recorded in registers R-R15 as follows. The address of the row containing the error is stored vertically in the registers R1-R15, in the column (bit position) where the error occurred. Thus for example, if an error was detected at row 15, bit position 4, the bit values 0, 0, 1, 1, 1, 1 (i.e. address 15) will be stored respectively in bit position 4 of registers R1, R2, R3, R4, R5, and R6 (shown as ROW1). Further, the valid bit V1 (i.e. register R7) at bit position 4 will be set indicating that the registers R1-R6 contain valid error information.

Still referring to FIG. 3, note that there is a second set of error information stored in registers R8-R14. Error information is stored in these registers in the same manner as described above for registers R-R7. The second set of registers is used to store a second error in the RAM under test at the same bit position, but at a different row address. Thus, continuing the example from above, if an error where detected at row 48 (i.e. address 48), bit position 4, the bit values 1, 1, 0, 0, 0, would be stored respectively in bit position 4 of registers R8, R9, R10, R11, R12, and R13 (shown as ROW2). Additionally, the valid bit V2 (i.e. register R14) at bit position 4 will be set to indicate the presence of valid error data.

According to the preferred embodiment of the present invention, each RAM section contains two spare rows and one spare column. As such, the same bit position is defective in more than two rows, then it follows that the RAM may only be repaired using a replacement column. To record the requirement that the RAM under test use column replacement rather than row replacement, a so called "must column" (MC) bit is provided in the test data array 60. Here the bit is stored for each column in register R15. So, continuing the example from above (i.e. error in bit position four, rows 15 and 48) if a third error were detected in bit position 4, the MC bit would be set indicating the these RAM errors must be repaired, if at all, using column replacement.

The actual test process using the test data array 60 for testing a RAM such as shown in FIG. 2 will now be discussed in detail. Implementing the following algorithm using the test data array described above, a RAM test can be accomplished in an invariant number of CPU (i.e. device under test) clock cycles regardless of the detection of RAM errors. According to the present invention, the general test sequence is expressed as following three rules. Hereinafter the following equivalencies will be used to indicate various logic functions: "•"=logical AND, "+"=logical OR, """= logical NOT, and "⊕"=logical XOR. Furthermore, "FAILURE" indicates that an error was detected at a particular bit of the currently addressed row in the RAM section. Thus, the test rules are expressed as:

1. if (FAILURE•V1') then {UPDATE ROW1}
2. if (FAILURE•V1•(ROW1-MATCHES-FAILURE-ROW'•V2')) then {UPDATE ROW2}
3. if (FAILURE•V1•(ROW1-MATCHES-FAILURE-ROW'•V2 & (ROW2-MATCHES-FAILURE-ROW')) then {SET MC}

The above rules may be implemented using processor level instructions to move data into and out of the appropriate registers to accomplish the particular march test. An example of the instruction code required to implement these test rules for the ALPHA AXP processor manufactured by Digital Equipment Corporation is shown in Appendix A.

Generally a RAM test proceeds using other general purpose registers, here R0 and R16-R30, to temporarily store and manipulate the test data. For example, in the preferred embodiment, register R30 (not shown) is used to store the address of the current RAM row being tested while R0 (not shown) is used to store failure bits for each column.

The test sequence for each row follows the following general path: 1) address a RAM row, 2) read the contents at that address, 3) compare read data to the expected result, 4) for every bit position in the row under test for which a failure is detected, place the address of the RAM row under test (from R30) into registers R-R6 if V1 is not set, or R7-R13 if V1 is set and V2 is not set or, if V1 and V2 are set, set the MC (must column bit).

A more detailed description of the test sequence may be expressed, using Boolean logic instructions (where for example, ROW1 <0> denotes the first bit of the address of the row being tested), as:

1. For "if (FAILURE & V1') then {UPDATE ROW1}"
ROW1<0> = ROW1<0> + (FAILURE-ROW<0> ● FAILURE ● V1')
ROW1<1> = ROW1<1> + (FAILURE-ROW<1> ● FAILURE ● V1')
ROW1<2> = ROW1<2> + (FAILURE-ROW<2> ● FAILURE ● V1')
ROW1<3> = ROW1<3> + (FAILURE-ROW<3> ● FAILURE ● V1')
ROW1<4> = ROW1<4> + (FAILURE-ROW<4> ● FAILURE ● V1')
ROW1<5> = ROW1<5> + (FAILURE-ROW<5> ● FAILURE ● V1')

2. For "if (FAILURE ● V1 ● (ROW1-MATCHES-FAILURE-ROW' ● V2')) then {UPDATE ROW2}"
ROW1-MATCH = ((FAILURE-ROW<5> ⊕ ROW1<5>)+
　　　　　　　(FAILURE-ROW<4> ⊕ ROW1<4>)+
　　　　　　　(FAILURE-ROW<3> ⊕ ROW1<3>)+
　　　　　　　(FAILURE-ROW<2> ⊕ ROW1<2>)+
　　　　　　　(FAILURE-ROW<1> ⊕ ROW1<1>)+
　　　　　　　(FAILURE-ROW<0> ⊕ ROW1<0>))'
ROW2<0> = ROW2<0> + (FAILURE-ROW<0> ● FAILURE ● V1 ● ROW1-MATCH' ● V2'
ROW2<1> = ROW2<1> + (FAILURE-ROW<1> ● FAILURE ● V1 ● ROW1-MATCH' ● V2'
ROW2<2> = ROW2<2> + (FAILURE-ROW<2> ● FAILURE ● V1 ● ROW1-MATCH' ● V2'
ROW2<3> = ROW2<3> + (FAILURE-ROW<3> ● FAILURE ● V1 ● ROW1-MATCH' ● V2'
ROW2<4> = ROW2<4> + (FAILURE-ROW<4> ● FAILURE ● V1 ● ROW1-MATCH' ● V2'
ROW2<5> = ROW2<5> + (FAILURE-ROW<5> ● FAILURE ● V1 ● ROW1-MATCH' ● V2'
VS = FAILURE ● V1 AND ROW1-MATCH' ● V2'

3. For "If (FAILURE ● V1 ● (ROW1-MATCHES-FAILURE-ROW' ● V2 & (ROW2-MATCHES-FAILURE-ROW')) then {SET MC}"
ROW2-MATCH = ((FAILURE-ROW<5>⊕ ROW2<5>)+
　　　　　　　(FAILURE-ROW<4>⊕ ROW2<4>)+
　　　　　　　(FAILURE-ROW<3>⊕ ROW2<3>)+
　　　　　　　(FAILURE-ROW<2>⊕ ROW2<2>)+
　　　　　　　(FAILURE-ROW<1>⊕ ROW2<1>)+
　　　　　　　(FAILURE-ROW<0>⊕ ROW2<0>))'

MC = FAILURE ● V1 ● ROW1-MATCH' ● V2 ● ROW2-MATCH'

By implementing the Boolean logic expressions above, 64 data structures (RAM cells) are tested and have their results stored in parallel. For example, consider the expression "ROW1 <0>=ROW1 <0>+(FAILURE-ROW<0>•FAILURE•V1')". Here, ROW1 <0> actually corresponds to the entire contents of register R1 (FIG. 3). So, in effect the Boolean operation is applied to 64 bits in parallel. This type of parallelism results in a much faster test than is achieved in prior art test systems and method.

Once each row of a RAM section is tested and the test data is recorded into registers R1–R15, the contents of registers R1–R15 is transmitted to the test system. After the entire RAM has been tested and all data has been collected, an analysis can be done to determine if the RAM is indeed repairable. Performing the reparability analysis on the test system allows for much more exhaustive and detailed analysis than would be possible by attempting to compute the repairability "on-the-fly". Furthermore, while the repairability analysis is being performed, the next RAM can be undergoing the testing and data collection process. By performing these functions in parallel, a much faster overall test process can be achieved.

Having described a preferred embodiment of the invention, it will be apparent to one of skill in the art that changes to this embodiment and other embodiments may be used without departing from the principles and spirit of the invention, the scope of which is defined by the appended claims.

APPENDIX A

```
; Alpha AXP Instructions used:   Instructions
;     BIS (bitwise logical OR)    Logical
;     AND (bitwise logical AND)
;     BIC (bitwise logical AND-NOT)
;     XOR (bitwise logical exclusive-OR)
;     SUBQ (arithmetic subtract quadword)
;     SRL (shift right logical)
;     CMOVLBS (conditional move on low bit set)

; General Purpose Registers Used
;     R1      ROW1<0>
;     R2      ROW1<1>
;     R3      ROW1<2>
;     R4      ROW1<3>
;     R5      ROW1<4>
;     R6      ROW1<5>
;     R7      V1
;     R8      ROW2<0>
;     R9      ROW2<1>
;     R10     ROW2<2>
;     R11     ROW2<3>
;     R12     ROW2<4>
;     R13     ROW2<5>
;     R14     V2
;     R15     MC
;
; explode row number across all columns
; first make every bit of R21 be the same as the low order bit
; of the row number
   SRL     R30,#7,R16
   SUBQ    R31,#1,R17          ; put low bit of row in bit 0
   BIS     R31,R31,R21         ; make all ones
   CMOVLBS R16,R17,R21         ; make all zeros
                               ; make R21 be row<0> in every position
; then make every bit of R22 be the same as the second lowest
; order bit of the row number
   SRL     R16,#1,R16
   BIS     R31,R31,R22         ; put next bit of row in bit 0
   CMOVLBS R16,R17,R22         ; make all zeros
                               ; make R22 be row<1> in every position
; then make every bit of R23 be the same as the third lowest
; order bit of the row number
   SRL     R16,#1,R16
   BIS     R31,R31,R23         ; put next bit of row in bit 0
   CMOVLBS R16,R17,R23         ; make all zeros
                               ; make R23 be row<2> in every position
; then make every bit of R24 be the same as the fourth lowest
; order bit of the row number
   SRL     R16,#1,R16
   BIS     R31,R31,R24         ; put next bit of row in bit 0
   CMOVLBS R16,R17,R24         ; make all zeros
                               ; make R24 be row<3> in every position
; then make every bit of R25 be the same as the fifth lowest
; order bit of the row number
   SRL     R16,#1,R16
   BIS     R31,R31,r25         ; put next bit of row in bit 0
   CMOVLBS R16,R17,r25         ; make all zeros
                               ; make r25 be row<4> in every position
; then make every bit of R26 be the same as the highest
; order bit of the row number
   SRL     R16,#1,R16
   BIS     R31,R31,R26         ; put next bit of row in bit 0
   CMOVLBS R16,R17,R26         ; make all zeros
                               ; make R26 be row<5> in every position
```

```
; update ROW1 ?
BIC     R0,R7,R16                ; R16 = (not V1) and FAILURE
; OR current row into ROW1
AND     R16,R21,R17              ; R1 = R16 and R21 or R1
AND     R16,R22,R18              ; R2 = R16 and R22 or R2
BIS     R17,R1,R1
BIS     R18,R2,R2
AND     R16,R23,R17              ; R3 = R16 and R23 or R3
AND     R16,R24,R18              ; R4 = R16 and R24 or R4
BIS     R17,R3,R3
BIS     R18,R4,R4
AND     R16,r25,R17              ; R5 = R16 and R25 or R5
AND     R16,R26,R18              ; R6 = R16 and R26 or R6
BIS     R17,R5,R5
BIS     R18,R6,R6
BIS     R16,R7,R7                ; V1 = V1 or R16
; Calculate (not ROW1-MATCH)
BIS     R31,R31,R16              ; init R16 = 0
XOR     R1,R21,R17               ; R16 = R16 or R1 xor R21
BIS     R17,R16,R16
XOR     R2,R22,R17               ; R16 = R16 or R2 xor R22
BIS     R17,R16,R16
XOR     R3,R23,R17               ; R16 = R16 or R3 xor R23
BIS     R17,R16,R16
XOR     R4,R24,R17               ; R16 = R16 or R4 xor R24
BIS     R17,R16,R16
XOR     R5,R25,R17               ; R16 = R16 or R5 xor R25
BIS     R17,R16,R16
XOR     R6,R26,R17               ; R16 = R16 or R6 xor R26
BIS     R17,R16,R20
                                 ; R20 is (not ROW1-MATCH)
; Update ROW2 ?
AND     R20,R7,R17
AND     R17,R0,R17
BIC     R17,R14,R16              ; R16 = (not ROW1-MATCH) and V1 and
                                 ;       (not V2) and FAILURE ; OR current row into ROW2
AND     R16,R21,R17              ; R8 = R16 and R21 or R8
AND     R16,R22,R18              ; R9 = R16 and R22 or R9
BIS     R17,R8,R8
BIS     R18,R9,R9
AND     R16,R23,R17              ; R10 = R16 and R23 or R10
AND     R16,R24,R18              ; R11 = R16 and R24 or R11
BIS     R17,R10,R10
BIS     R18,R11,R11
AND     R16,R25,R17              ; R12 = R16 and R25 or R12
AND     R16,R26,R18              ; R13 = R16 and R26 or R13
BIS     R17,R12,R12
BIS     R18,R13,R13
BIS     R16,R14,R14              ; V2 = V2 or R16

; Calculate (not ROW2-MATCH)
BIS     R31,R31,R16              ; init R16 = 0
XOR     R8,R21,R17               ; R16 = R16 or R8 xor R21
BIS     R17,R16,R16
XOR     R9,R22,R17               ; R16 = R16 or R9 xor R22
BIS     R17,R16,R16
XOR     R10,R23,R17              ; R16 = R16 or R10 xor R23
BIS     R17,R16,R16
XOR     R11,R24,R17              ; R16 = R16 or R11 xor R24
BIS     R17,R16,R16
XOR     R12,R25,R17              ; R16 = R16 or R12 xor R25
BIS     R17,R16,R16
XOR     R13,R26,R17              ; R16 = R16 or R13 xor R26
BIS     R17,R16,R21              ; R21 is (not ROW2-MATCH)
; Set MC ?
AND     R0, R21, R16
AND     R20,R16,R16
AND     R14,R16,R16
AND     R7,R16,R16               ; R16 = V1 and (not ROW1-MATCH) and V2 and
                                 ;       (not ROW2-MATCH) and FAILURE BIS     R15,R16,R15              ; Set MC
```

What is claimed is:

1. A test system for testing a random access memory (RAM) comprising:

means for testing a plurality of storage cells of said RAM;

means for storing an output of said testing means;

where said testing means and said storing means operate in a fixed number of central processing unit (CPU) clock cycles defined by a test executed by said testing means regardless of any detected errors.

2. The apparatus of claim 1 wherein said RAM and said CPU reside on a single silicon die.

3. The apparatus of claim 2 wherein said RAM is a cache memory of said CPU.

4. The apparatus of claim 1 wherein said plurality of storage cells includes at least 64 storage cells.

5. The apparatus of claim 4 wherein said storing means includes general purpose registers associated with said CPU.

6. The apparatus of claim 4 wherein said output of said testing means includes results for said at least 64 storage cells and wherein said storing means operates to store all said results for said at least 64 storage cells simultaneously.

7. A test system for testing a random access memory (RAM) comprising:

contacting means for establishing an electromechanical contact with a device under test (DUT), where said DUT contains said RAM;

processor means coupled to the contacting means for providing test patterns to said DUT;

means for accessing general purpose registers within said DUT;

means for accessing individual cells of said RAM for reading data therefrom and writing data thereto;

means for testing and recording, in parallel, a plurality of said RAM cells, where said testing and recording means operate in a fixed number of clock cycles defined by a test program executed by said testing means regardless of detection by said testing means of any errors in said RAM cells.

8. The test system of claim 7 wherein said DUT is a central processing unit (CPU).

9. The test system of claim 8 wherein said testing means instruction executing means within said CPU.

10. The apparatus of claim 9 wherein said storing means includes general purpose registers of said CPU.

11. The apparatus of claim 7 wherein said plurality of RAM cells includes at least 64 storage locations.

12. The apparatus of claim 11 wherein said testing means operates to test each of said 64 storage locations in parallel and wherein said recording means operates to store, in parallel, each result of testing said 64 storage locations.

13. The apparatus of 12 wherein said RAM includes a plurality of sections and wherein said test system operates to transmit contents of said recording means to said processor means after each of said sections is tested.

14. A method for testing a random access memory (RAM) comprising the steps of:

writing data to a plurality of storage cells of said RAM;

reading contents of said plurality of storage cells;

comparing each value associated with each of said storage cells to an expected value;

recording, in a test system, results of said comparing step for each of said storage cells; and evaluating, on said test system, the reparability of said plurality of said storage cells while performing said writing, reading, and comparing steps for another plurality of storage cells of said RAM.

15. The method of claim 14 wherein said plurality of storage cells includes at least 64 storage cells.

16. The method of claim 14 wherein said writing, reading, comparing, and recording steps occur in a fixed number of central processor clock cycles regardless of detected errors.

17. The method of claim 14 wherein said RAM is a repairable RAM including at least one replacement row and at least one replacement column and wherein said comparing step further includes the step of:

determining if said RAM must be repaired using said replacement column.

18. The method of claim 14 further wherein said RAM includes a plurality of sections each containing a plurality of said storage cells and wherein said recording step further includes the step of:

after each one of said plurality of sections has been tested, transmitting its corresponding results to a processor means for subsequent analysis.

19. A method of testing a cache memory of a central processing unit (CPU) comprising the steps of:

coupling said CPU to a test processor;

using CPU instructions and a first set of general purpose registers of said CPU, writing data supplied by said test processor to a plurality of storage cells of said cache memory;

comparing, in parallel, contents of said plurality of storage cells to expected values; and recording, in parallel, results of said comparing step in a second set of general purpose registers of said CPU.

20. The method of claim 19 wherein said cache memory includes a plurality of sections each including a plurality of said storage cells and said second set of general purpose registers is capable of storing test results for one of said sections, wherein said recording step further includes:

after each of said sections has been tested, transmitting contents of said second set of general purpose registers to said test processor.

21. The method of claim 19 wherein said cache memory is a repairable RAM having at least one replacement row and one replacement column and wherein said comparing step includes:

determining that one of said sections being tested must be repaired using said replacement column.

* * * * *